(12) United States Patent
Richiuso (10) Patent No.: US 6,201,679 B1
(45) Date of Patent: Mar. 13, 2001

(54) INTEGRATED ELECTRICAL OVERLOAD PROTECTION DEVICE AND METHOD OF FORMATION

(75) Inventor: Dominick Richiuso, Saratoga, CA (US)

(73) Assignee: California Micro Devices Corporation, Milpitas, CA (US)

( * ) Notice: Subject to any disclaimer, the term of this patent is extended or adjusted under 35 U.S.C. 154(b) by 0 days.

(21) Appl. No.: 09/326,499

(22) Filed: Jun. 4, 1999

(51) Int. Cl.[7] .................................................. H02H 5/04
(52) U.S. Cl. ........................ 361/103; 361/124; 361/93.8; 337/297
(58) Field of Search ................................... 361/103, 104, 361/93.8, 124; 29/623; 337/107, 139, 142, 158, 159, 160, 290, 297, 306, 405

(56) References Cited

U.S. PATENT DOCUMENTS

| | | | | |
|---|---|---|---|---|
| 4,652,848 | * | 3/1987 | Hundrieser | 337/297 |
| 4,862,134 | * | 8/1989 | Poerschke et al. | 337/231 |
| 5,097,247 | * | 3/1992 | Doerrwaechter | 337/405 |
| 5,099,219 | * | 3/1992 | Roberts | 337/297 |
| 5,148,141 | * | 9/1992 | Suuronen | 337/297 |
| 5,367,280 | * | 11/1994 | Thiel et al. | 337/297 |
| 5,456,942 | * | 10/1995 | Bebak et al. | 427/97 |
| 5,552,757 | * | 9/1996 | Blecha et al. | 337/297 |
| 5,606,301 | * | 2/1997 | Ishimura | 337/290 |
| 5,923,239 | * | 7/1999 | Krueger et al. | 337/297 |

* cited by examiner

Primary Examiner—Michael J. Sherry
(74) Attorney, Agent, or Firm—Beyer Weaver & Thomas LLP (57) ABSTRACT

An integrated electrical overload protection device and method of formation which functions as a thermal fuse. The device is integrated directly on the underlying structural or foundational material of an electrical circuit which experiences the electrical overstress. The device can be formed according to standard semiconductor process steps when formed on a semiconductor substrate. The device, or fuse, includes a first and second contact area separated by a gap area. A least a portion of the upper surfaces of the contact areas are covered with a wettable material such as gold. A solder bump, or bridge, is applied which spans the contact areas and provides an closed electrical connection. Upon application of an overload condition across the bridge material, a rise in temperature causes the solder material to melt. The solder flows onto the wettable areas and is drawn out of the gap area to thereby disrupt the electrical connection between the contact areas. The contacts areas, gap, and solder material can be varied to provide fuses with different characteristics.

22 Claims, 9 Drawing Sheets

INTEGRATED ELECTRICAL OVERLOAD PROTECTION DEVICE AND METHOD OF FORMATION

BACKGROUND OF THE INVENTION

1. Field of the Invention

The present invention relates to an electrical overload protection device that is integrated directly on the underlying structure of an electronic device. More particularly, the device which functions as a thermal fuse, is integrated directly on the substrate of a semiconductor device, and serves to protect associated system elements from electrical overstress conditions, thus insuring a failsafe mode of operation.

2. Description of Prior Art

A variety of fuses and breaker switches exist to protect electrical circuits or devices from overstress conditions. Such overstress conditions might include, for example, a lightning strike, a power surge, or more simply an overload condition being supplied at the power input terminal of the circuit or device. When such an overload condition exists, the electrical resistance of the device produces heat. While heat dissipation devices can be used (e.g., fans, heatsinks, and the like), they are generally not adequate to compensate for extreme overload conditions. If the overload condition persists, then the heat buildup may become great enough to melt and/or destroy key components, or the entire electrical circuit. Fires might even result in one component or device, and the fire can then spread and destroy an entire system.

In the past, thermal fuses have been used to guard against overstress conditions. A thermal fuse uses the heat generated by the electrical resistance and overload condition to break the electrical connection between two points on the circuit. This is usually accomplished by the overload condition heat causing an electrical contact point to melt, thereby severing the contact. In the past, such thermal fuses have been incorporated, as separate devices between the power input and an electrical device to be protected.

Several drawbacks exist, however, to the use of separate and distinct thermal fusing components. By way of example, and not limited to such, these drawbacks might include; first, thermal fuses are generally large components, and may be hard to incorporate in smaller electrical packages, particularly semiconductor packages; second, the thermal fuse might, under certain conditions, explode or expel byproducts, thereby damaging neighboring components or devices which the fuse was ultimately slated to protect; and third, the contact point material, which melts during an overstress condition, might drip or flow over neighboring components. Such hot, dripping material might thereafter cause short circuits, further overheating, fires, and/or other related damage to the neighboring components. Ultimately the entire system into which the components were incorporated might fail or be damaged. Moreover, separate thermal fuse components are generally not an integral part of the circuit which is generating heat due to the overstress condition. As a result, it is difficult for the fuse and the circuit to be at the same temperature. It is therefore possible that the device may overheat sufficiently before the separate fuse component opens, thereby causing a possible hazardous failure condition. One such condition would be where the device connections meet (or short out) and the resulting failure causes the device to fall off the printed circuit board to which it was soldered. This wayward part could thereby result in a possible short circuit or fire hazard in surrounding boards, or system-wide.

Accordingly, what is needed in the field is a thermal fuse which exists, or can be formed, integrally with an overall circuit, or collection of components. In particular, the thermal fuse should be capable of achieving a very small size, and yet still provide adequate overstress condition protection. The fuse should be integrated in the foundational material of the underlying device. Incorporation into a semiconductor circuit substrate would prove to be most useful. The fuse should also operate without jeopardizing neighboring components with dripping contact material, expulsions, or the like.

SUMMARY OF THE INVENTION

The present invention provides a thermal fuse device which can be formed integrally on an electrical circuit with other components. In particular, the thermal fuse device can be integrally formed, in many different shapes and/or sizes, on the underlying structural or foundational material which comprises the electrical circuit. A monolithic structure would include formation of the thermal fuse device according to its process steps. This provides a thermal fuse which is intimately linked with the various components of the circuit. In operation, the fuse is normally closed, and will sever an electrical contact according to overstress and/or heating conditions which are common to both the fuse and the underlying components with which the fuse is integrated.

According to one aspect of the present invention, the thermal fuse device includes first and second formed electrical contact areas which are separated by a gap. The contact areas are coated with underbump metallurgy (UBM) materials, and then a wettable material thereafter. The gap area is kept free from such wettable material. A solder bump is then formed (e.g., plated, screened, etc.) in the center of the formation, thereby spanning the gap and forming a bridge between the first and second contact areas. A flux is applied to the solder. When an electrical overstress condition is imposed between the contacts, the solder bump is heated to the point of melting. The wicking effect of the wettable material on the contact areas draws the molten solder out of the gap and onto the contact areas. Once the solder is completely melted and wicked away from the gap, then the electrical connection between the contact areas is severed, and the overload condition is isolated from the remainder of the components. The solder is also relatively contained on the wettable areas of the contact areas, and will not generally drip or flow elsewhere.

According to another aspect of the present invention, the present method of forming the thermal fuse is particularly adaptable to implementation directly on a semiconductor substrate according to standard manufacturing techniques, or process steps. Example steps include, in relevant part, but are not limited to the following: Forming conductive contact areas on an oxide layer which in turn is formed on an underlying substrate material. UBM layers are sputtered, as needed, thereafter. A photoresist mask is then applied to define the wetting area. A wettable material such as gold is plated on the defined contact areas, and the photoresist is stripped off. A photoresist mask is next applied to isolate the gap area between the contact areas. The UBM material is etched away from the gap area and the photoresist is stripped away. A photoresist mask is next applied to define the solder bridge area. A solder bump is formed on this defined area, and the photoresist is stripped away. A flux is thereafter applied to the solder area. The incoming power to the overall substrate devices can be connected through this integrated thermal fuse which, according to its design, will melt and wick away the solder, thereby severing the electrical connection if an overload condition occurs.

The thermal fuse, and in particular the electrical contact areas and gap therebetween can be designed according to many different shapes, sizes, and configurations. By varying certain parameters such as the contact area size, the gap width and depth, and the melting point of the solder material that bridges the contact areas, the fuse can be sized and designed to respond successfully to a variety of different overload conditions. The present invention is intended to include both the integrated thermal fuse, and the method for its formation.

These and other advantages of the present invention will become apparent upon reading the following detailed descriptions and studying the various figures of the drawings.

DETAILED DESCRIPTION OF THE PREFERRED EMBODIMENTS

An invention is described herein for providing a thermal fuse which can be integrated directly into the underlying structure of an electrical circuit. According to one aspect of the present invention, a thermal fuse structure is provided that can be formed directly on the substrate/oxide layers comprising a semiconductor circuit layout. For a monolithic structure, the thermal fuse device would be formed according to the process steps for the structure. Upon application of an overload condition on the thermal fuse structure, a solder bridge between two electrical contacts melts and severs the electrical connection. The molten solder then flows onto wetted areas on the contacts and is relatively contained. The integration of the fuse directly on the circuit structure provides for more direct protection of associated components comprising the system.

For ease of discussion, a example semiconductor layout of the thermal fuse structure is shown. While this example uses certain materials, layering configurations, process steps, and the like for its formation, the present invention is not intended to be limited to such specifics. In particular, the formation of the integrated thermal fuse structure might include other layering configurations or process steps, which provide the same general functionality. This functionality includes that of severing of an electrical connection between two contacts via the melting solder bridge in response to the heat of an overload condition. The solder then flows (and is relatively contained) in the wetted areas of the contact surfaces. These functions exist in an integrated thermal fuse.

Moreover, while the examples show metal contact areas of a certain shape and size, the present invention is intended to include any and all such other functional shapes and sizes. It is recognized that various other contact area shapes, along with (but not limited to) the variation of such other parameters as gap width, gap depth, solder material, and the like, will produce a variety of thermal fuses that respond differently to overload conditions. In this way, a thermal fuse can be designed according to size constraints, and/or with certain response times and response characteristics, as needed.

Figure 1:
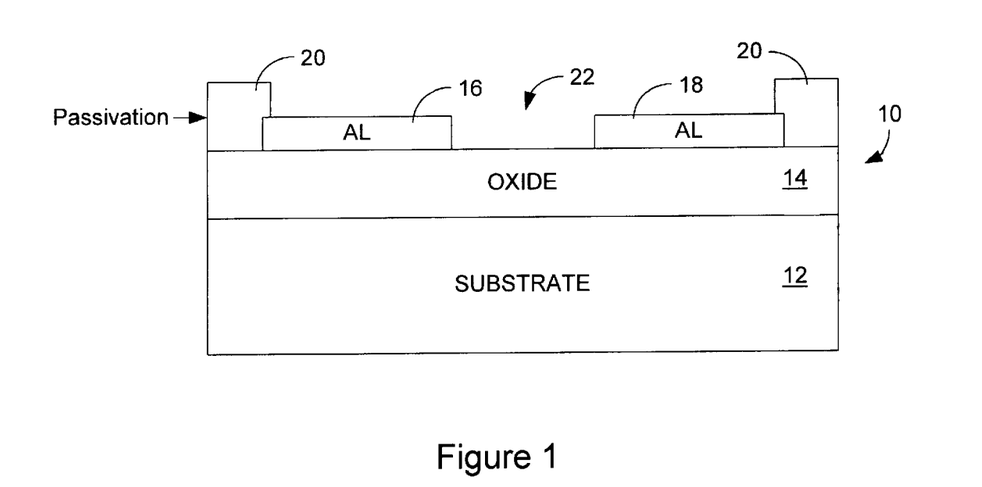
FIG. 1 illustrates, in accordance with one aspect of the present invention, an example semiconductor layout of an integrated thermal fuse structure, showing the proximate arrangement of the metal contact areas.

In accordance with one aspect of the present invention, FIG. 1 shows an example semiconductor layout of an integrated thermal fuse structure 10. A substrate layer 12 serves as the basis of the semiconductor layout. An oxide layer 14 is next applied over the substrate layer 12. A first a second contact areas 16 and 18 are deposited, or formed, on the oxide layer 14. In this instance, the contact areas are shown comprised of aluminum, however, other metals or conductive materials might similarly be used. A passivation layer 20 is shown surrounding the contact areas 16 and 18. The passivation material (typically SiN) protects the various areas of the semiconductor chip from exposure and/or contamination, and is removed to expose necessary areas for formation of device structures, such as the thermal fuse illustrated. The contact areas 16 and 18 are shown in proximate relation to each other and are separated by a gap area 22.

Figure 2:
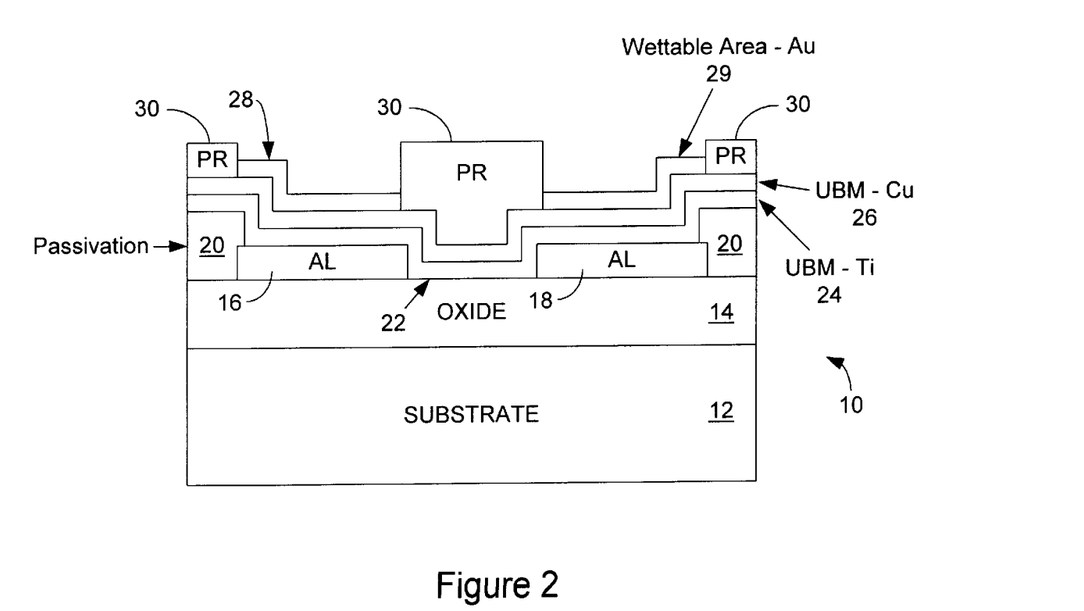
FIG. 2 illustrates, in accordance with one aspect of the present invention, the example semiconductor layout of the integrated thermal fuse structure of FIG. 1, further showing application of the UBM layers and wetting areas.

Referring now to FIG. 2, the example semiconductor layout of the integrated thermal fuse structure 10 from FIG. 1 is shown (with similar reference numerals). Further depicted is the addition of an underbump metallurgy (UBM) layer. In this example, a first UBM layer 24 (of material Ti) is applied across the structure. A second UBM layer 26 (of material Cu) is applied thereafter. The Ti layer 24 serves as a barrier and adhesion layer for the underlying Al layer 16 and solder. The Cu is applied as a SEED layer for the subsequently applied wettable material. While not limited to such, other materials which might be used in place of the Ti include Ni, NiV, TiW, and Ta. In place of the Cu, other materials might include Ni, Au, or W. A photoresist material 30 is applied over layer 26 to define wettable areas 28 and 29, located over the respective contact areas 16 and 18. A layer of gold (Au) is plated across the exposed wettable areas 28 and 29, with the gold not plating to the photoresist. Other wetting materials which might be used include, for instance, Pd and Pt. The photoresist layer is thereafter stripped away.

Figure 3:
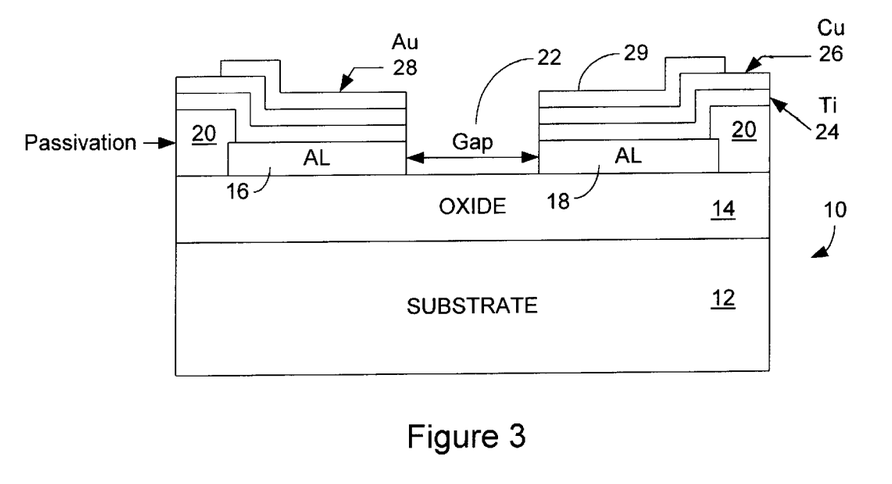
FIG. 3 illustrates, in accordance with one aspect of the present invention, the example semiconductor layout of the integrated thermal fuse structure of FIG. 2, further showing etching of the gap area.

FIG. 3 next shows the example semiconductor layout of the integrated thermal fuse structure 10 from FIG. 2 (with similar reference numerals), but further showing formation of the gap area 22. The sputtered layers of UBM material (e.g., Ti 26 and Cu 28) need to be removed from the gap area 22, as no wettable area will be made to exist there. A photoresist mask is applied (not shown) which isolates the gap area 22. The UBM layers 26 and 28 are etched away. The gap area 22 has now been made to extend between the contact areas 16 and 18.

Figure 3A:
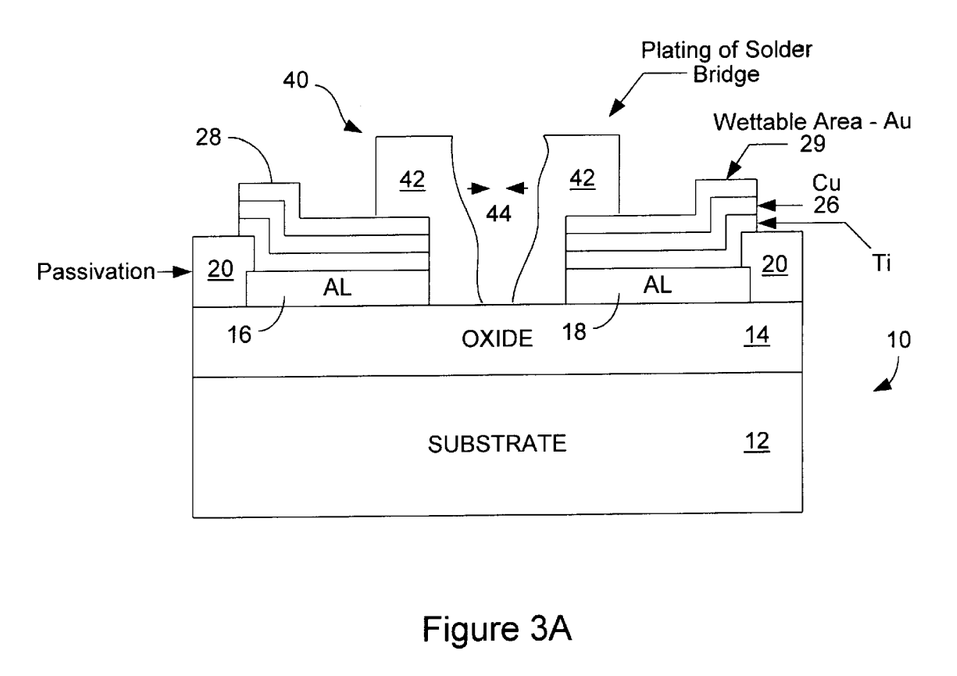
FIG. 3a illustrates, in accordance with one aspect of the present invention, the example semiconductor layout of the integrated thermal fuse structure of FIG. 2, further showing formation of the solder bridge.

In FIG. 3a, the example semiconductor layout of the integrated thermal fuse structure 10 from FIG. 3 is shown (with similar reference numerals). A photoresist mask (not shown) is applied to define a solder bump formation area 40. Solder 42 is formed in this area 40. As the solder bridge is formed, it first plates to wettable areas 28 and 29. The bridge then grows inward, as shown by arrows 44.

Figure 4:
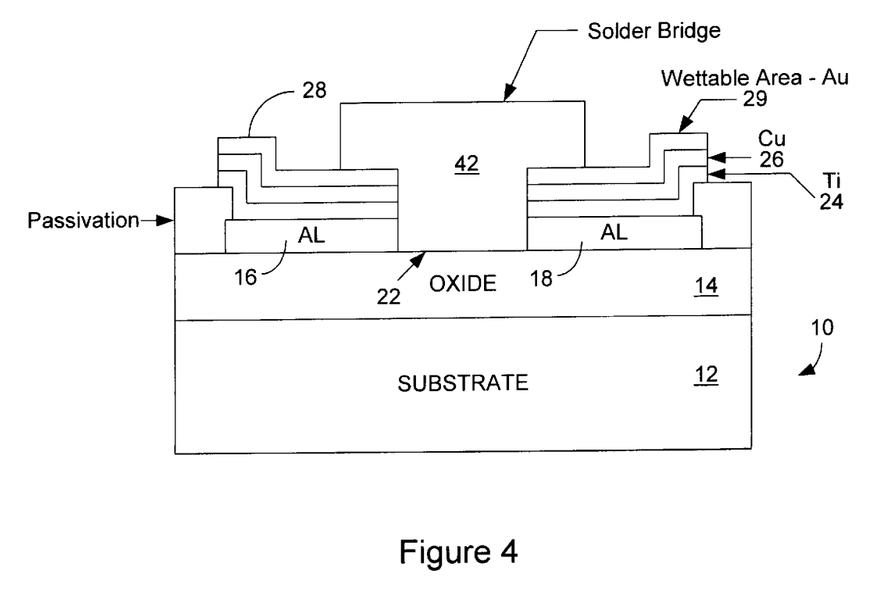
FIG. 4 illustrates, in accordance with one aspect of the present invention, the example semiconductor layout of the integrated thermal fuse structure of FIG. 3, further showing formation of the solder bridge.

Referring now to FIG. 4, the example semiconductor layout of the integrated thermal fuse structure 10 from FIG. 3a is shown (with similar reference numerals). The completed solder bridge 42 has been formed across the gap area 22. The solder bridge 42 thereby spans the contact areas 16 and 18 and provides an electrical path across the fuse structure 10. The thermal fuse is, therefore, a normally closed switch.

Figure 5:
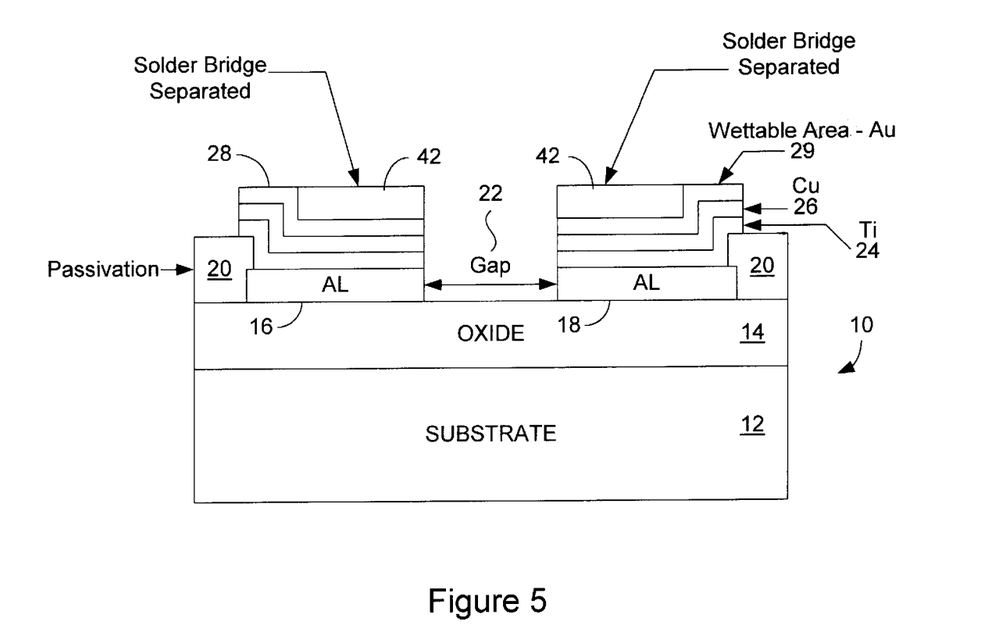
FIG. 5 illustrates, in accordance with one aspect of the present invention, the example semiconductor layout of the integrated thermal fuse structure of FIG. 4, further showing the separation of the solder bridge in response to a overload condition.

FIG. 5 shows the example semiconductor layout of the integrated thermal fuse structure 10 from FIG. 4 (with similar reference numerals). In this instance, an overload condition has been applied across the contact areas 16 and 18 of the thermal fuse structure 10. Normally, the solder bridge 42 provides a continuous path or connection between the two contact areas (or terminals) of the fuse structure 10. Upon application of a power overstress condition, the structure will heat up, ultimately reaching the melting point of the solder bridge 42. When this occurs the solder bridge material 42 melts and withdraws from the gap area 22 to fill and coat the wettable areas 28 and 29 surround the solder. Since the gap area 22 is void of any wettable surface, the solder will easily be removed from the gap area 22 and "wick" to the surrounding wettable areas. When this occurs, the connection between the fuse terminals, as previously provided by the solder bridge 42, is now open. This interrupts any flow of current through the fuse, thereby removing (or isolating) the condition which caused the heating to occur in the first place.

Figure 6:
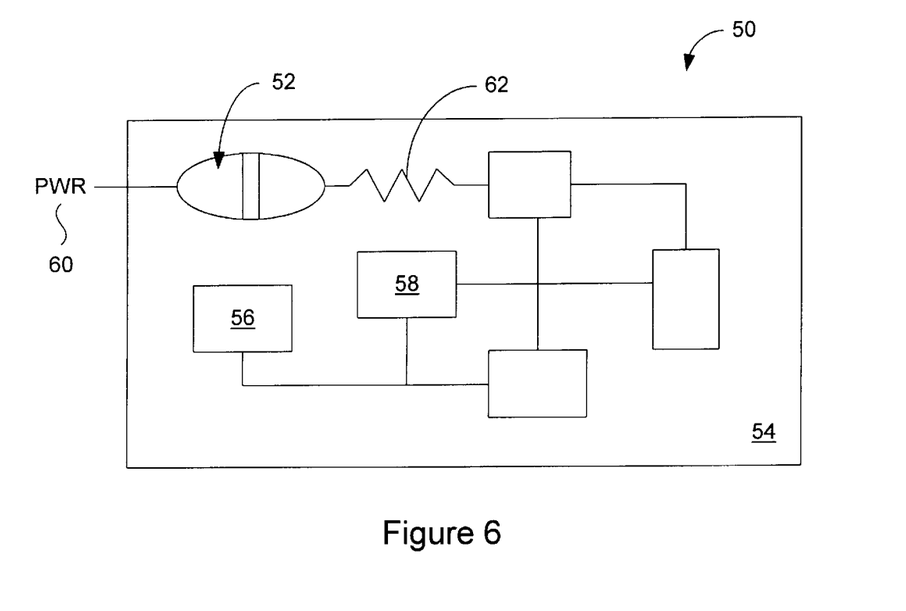
FIG. 6 illustrates, in accordance with another aspect of the present invention, an example thermal fuse structure which has been directly integrated into a circuit structure.

FIG. 6 shows a top-down view of a representative circuit layout 50, wherein the thermal fuse element 52 has been integrated directly on the substrate material 54 which serves as a structural base for other electronic elements (e.g., 56 and 58) forming the circuit. The power input 60 is placed across the thermal fuse element 52 which is typically followed by a resistor element 62.

Figure 7:
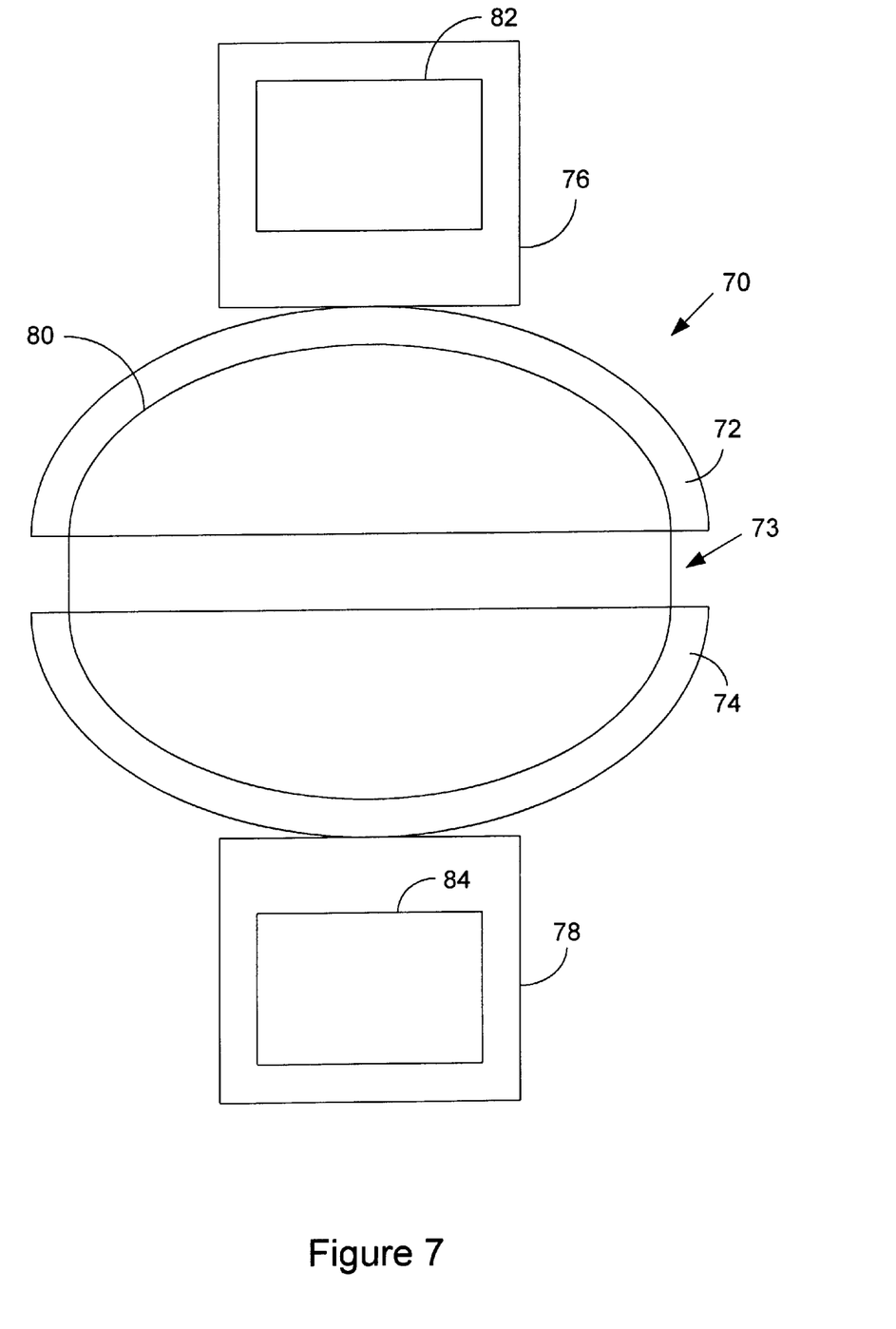
FIG. 7 illustrates, in accordance with another aspect of the present invention, a top-down view of an example thermal fuse structure, showing the proximate arrangement of the metal contact areas.

Referring now to FIG. 7, an alternative top-down view of the thermal fuse structure 70 is shown. The manufacturing or processing steps parallel those discussed in FIGS. 1–5. A first contact area 72 is shown arranged across from a second contact area 74. Each contact area is accompanied by a respective terminal area 76 and 78. As similarly discussed above, the entire structure is covered with a passivation material, such as SiN. An opening 80 in the passivation material is created (i.e., etched via a mask) over the contact areas 72 and 74. Openings 82 and 84 are also similarly created over the respective terminal areas 76 and 78.

Figure 8:
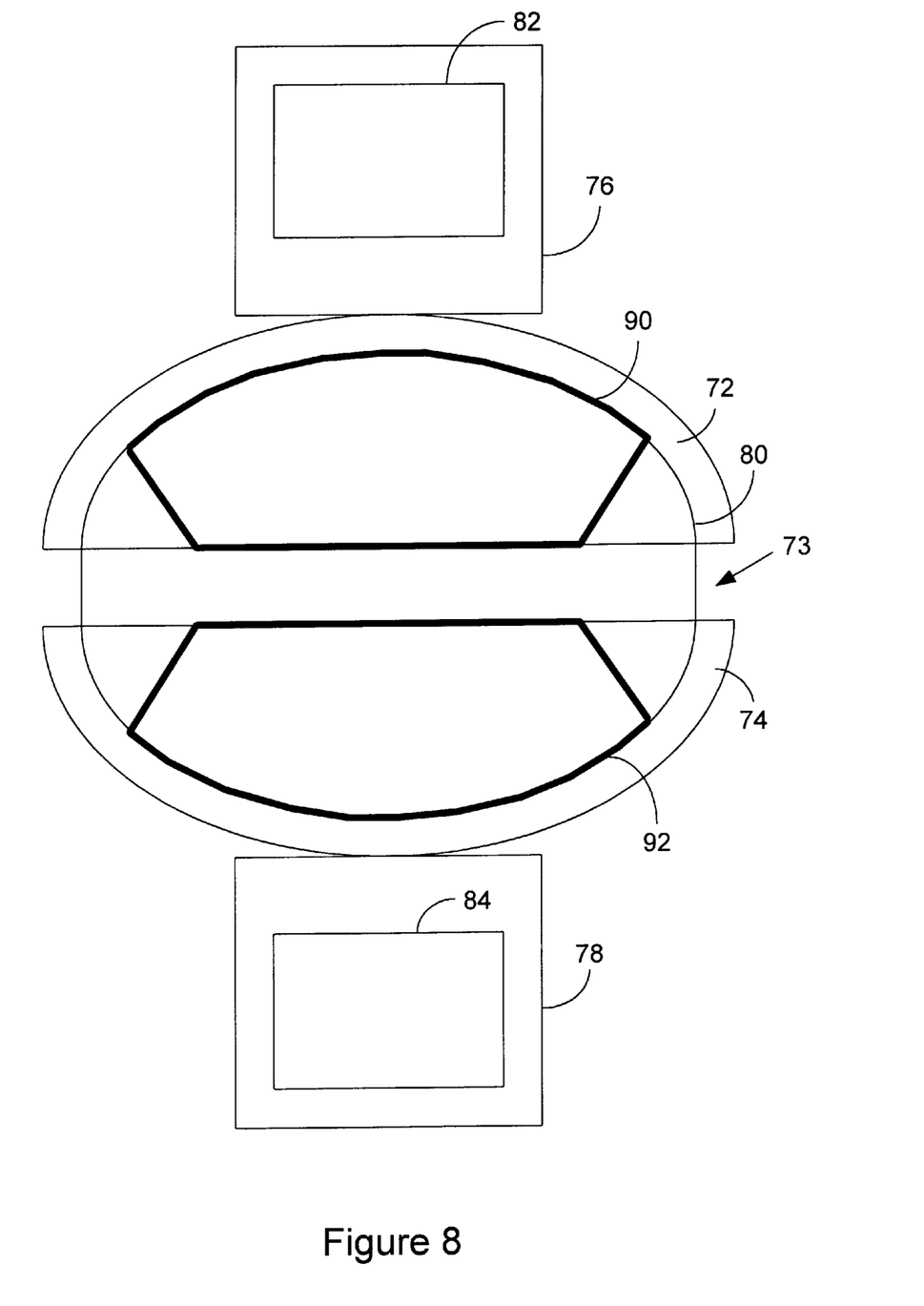
FIG. 8 illustrates, in accordance with another aspect of the present invention, the top-down view of the example thermal fuse structure of FIG. 7, further showing formation of the wetting areas.

FIG. 8 shows yet a subsequent top-down view of the thermal fuse structure 70 of FIG. 7 (with similar reference numbers). In this view, the UBM layers of Ti and Cu (as example materials) are applied to the passivation opening 80 via a sputtering process. Next, a photoresist mask is applied which leaves open and defines the wetting areas 90 and 92 (shown in bold line) which are located over the exposed areas of the respective contact areas 72 and 74. A wetting material is then applied, in this instance gold, via a formation process (e.g., plating, screening, etc). The photoresist mask is then stripped away.

Figure 9:
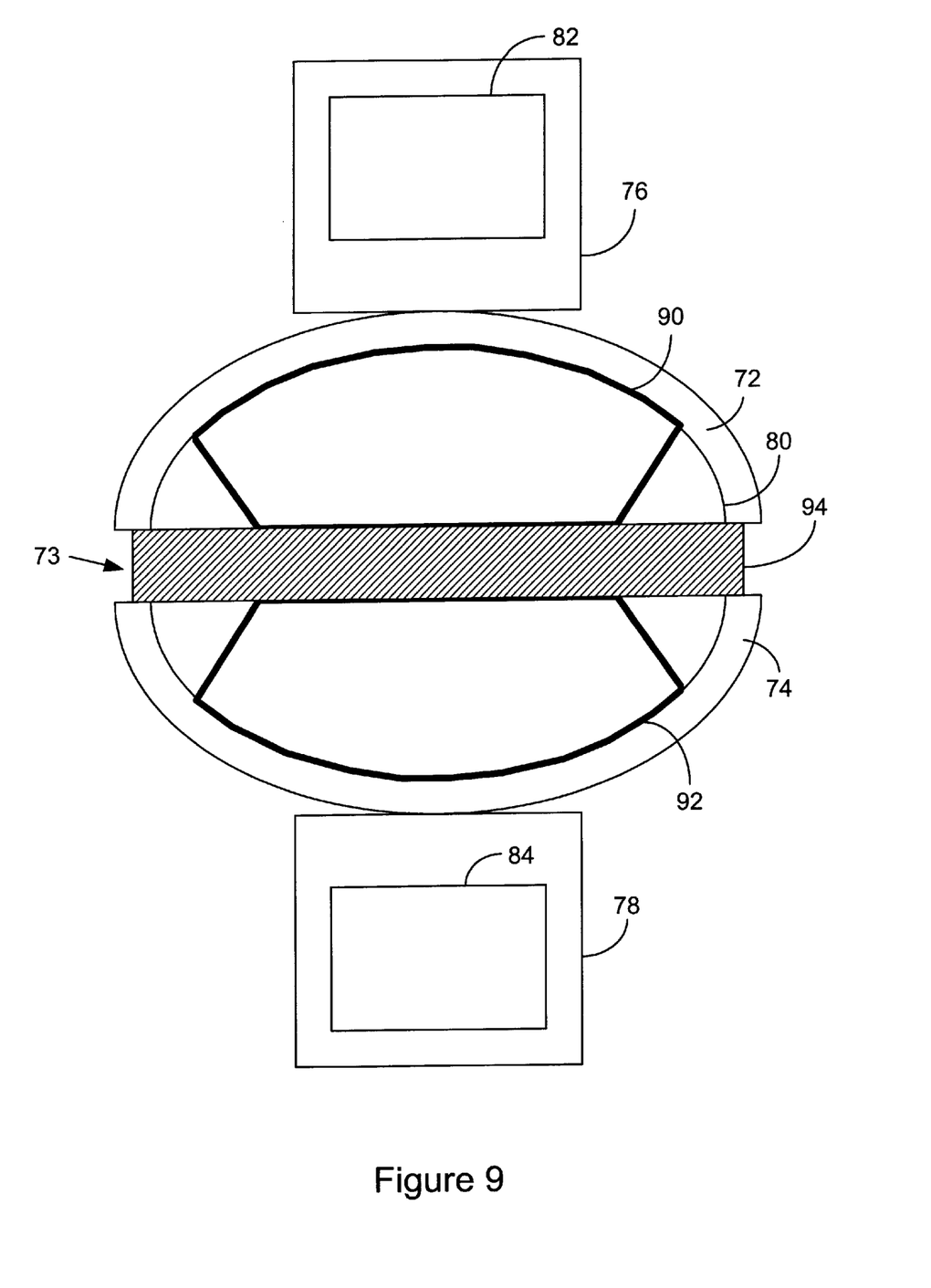
FIG. 9 illustrates, in accordance with another aspect of the present invention, the top-down view of the example thermal fuse structure of FIG. 8, further showing application of a gap formation mask.

FIG. 9 next shows a subsequent top-down view of the thermal fuse structure 70 of FIG. 8 (with similar reference numbers). In this view, a new photoresist mask layer 94 is applied to isolate and define the gap area 73 between the contact areas 72 and 74 (wherein region 94 represents the gap mask opening). The layers of Ti, Cu, and Au are etched away so that the gap 73 extends down to the oxide layer between the contact areas 72 and 74. The photoresist is thereafter stripped away.

Figure 10:
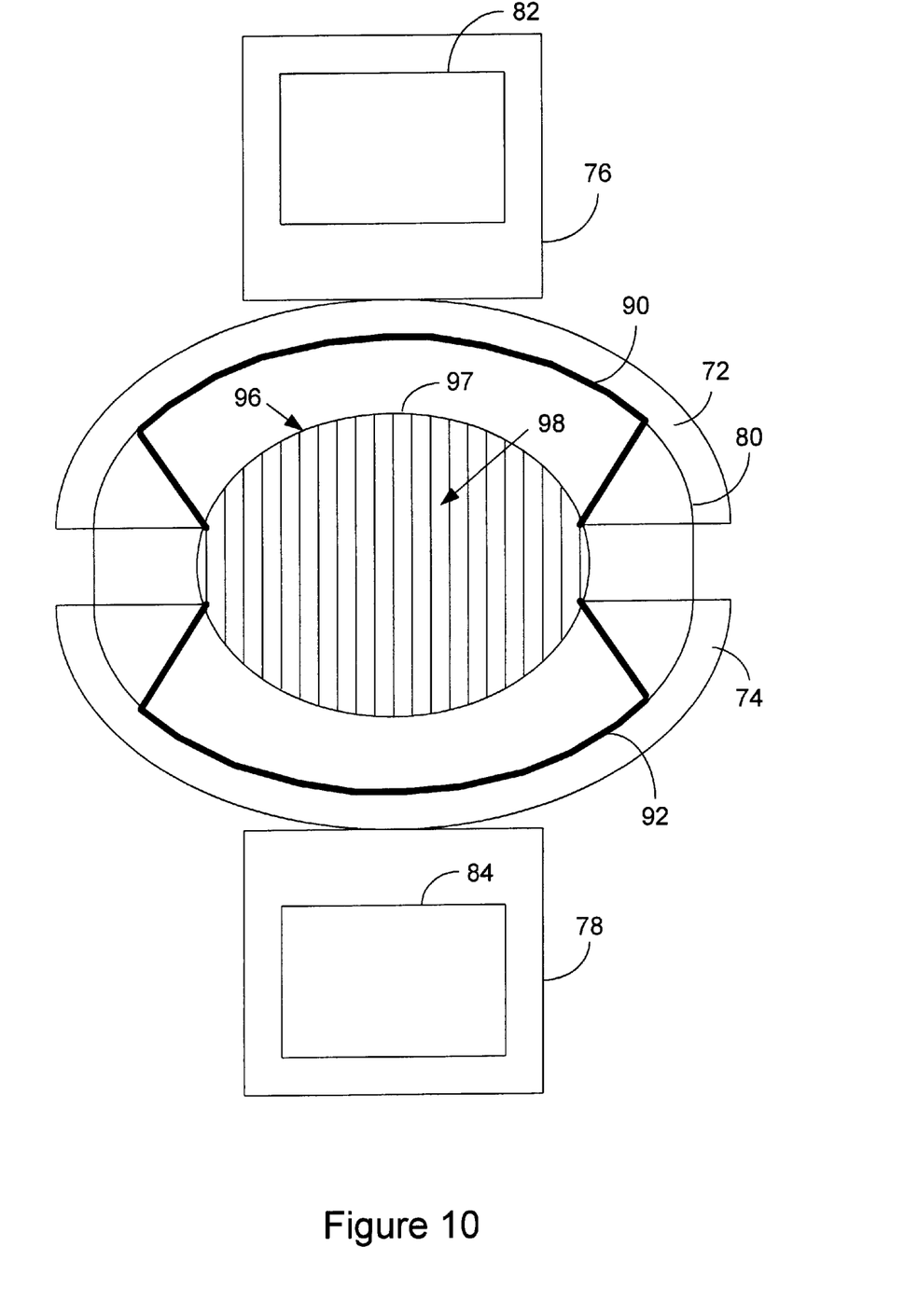
FIG. 10 illustrates, in accordance with another aspect of the present invention, the top-down view of the example thermal fuse structure of FIG. 9, further showing formation of a solder bridge.

Referring now to FIG. 10, the next subsequent top-down view of the thermal fuse structure 70 of FIG. 9 is shown (with similar reference numbers). A photoresist mask is applied to isolate and define the solder bridge area 96 (wherein region 96 represents the solder bridge mask opening). The solder bump of solder material 98 is thereafter plated into this area 96 to form the solder bridge 97 which spans the first contact area 72 and the second contact area 74.

Figure 11:
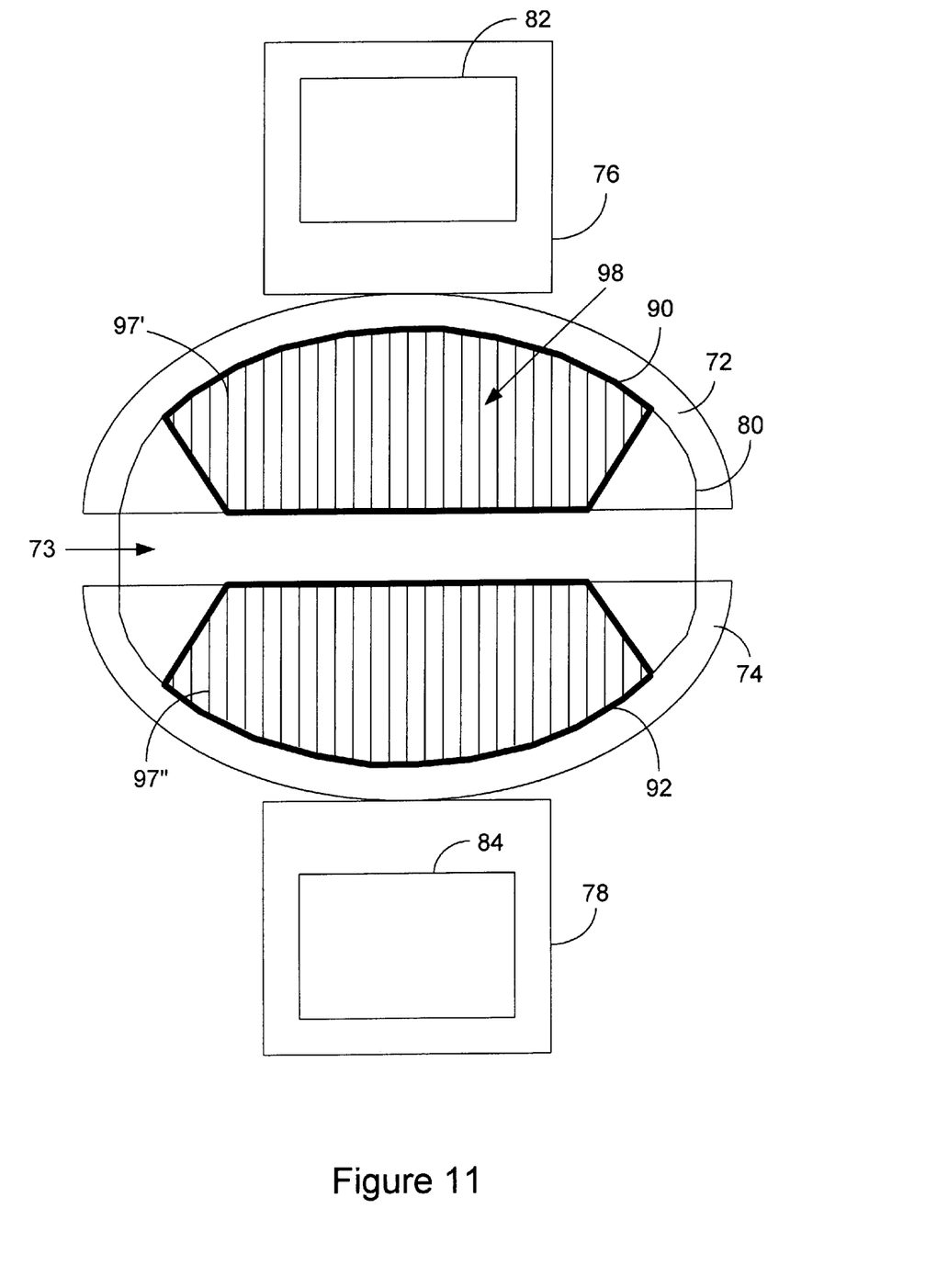
FIG. 11 illustrates, in accordance with another aspect of the present invention, the top-down view of the example thermal fuse structure of FIG. 10, further showing separation of the solder bridge to the wetted contact areas.

FIG. 11 next shows the subsequent top-down view of the thermal fuse structure 70 of FIG. 9 (with similar reference numbers). An overload (or overstress) condition has been applied across the contact areas 72 and 74 through the solder bridge 97 (from FIG. 10). The overload condition has produced temperatures high enough to melt the solder bridge 97. The flowable solder material 98 has been drawn onto the wetted areas 90 and 92, and out of the gap area 73. As a result, the solder material 98 is relatively contained on the wetted areas 90, 92, and the electrical connection between contact areas 72 and 74 has been severed, thereby opening the electrical connection.

The present inventive concept applies equally well to other sizes and shapes of contact areas 72 and 74. While semi-circular shapes are used in this example, they are not intended to be limiting. Other functional shapes might also be used, including for instance squares, triangles, polygons, trapezoids, and the like. The gap area 73 can also be varied in overall depth and width. A smaller (shallower) gap will be easier to bridge when plating the solder bump (as per FIG. 3a). However, a smaller gap might also open too quickly for a particular application. The solder bump can be formed from a variety of different compositions and thicknesses. The behavior of different solder compositions is understood in the art. Adjustments and variations can be made to the thermal fuse configurations and material compositions to provide different melting temperatures. As a result, the delay time for breaking the electrical contact can be designed and configured accordingly.

It should also be noted that, while not illustrated in detail, different circuit packaging materials can be successfully used with the present invention. Most semiconductor circuits are encapsulated in a molded epoxy casing, which is generally a less expensive packaging means. Such casings have proven to be functionally capable of allowing the solder bump material to adequately flow onto the wetted areas of the contacts. However, in the event that certain designs need more space (or less compression) to operate, an open casing can be used, wherein the circuit is mounted in the well of a base structure and a cap is sealably placed over the well.

The integrated thermal fuse of the present invention can be produced by those skilled in the art using procedures analogous to that disclosed herein and employing modifications readily apparent to them in view of this disclosure. It should be noted that there are many alternative ways of implementing the methods and apparatus of the present invention. It is therefore intended that the following appended claims be interpreted as including all such alterations, permutations, and equivalents as fall within the true spirit and scope of the present invention.

What is claimed is:

1. An integrated thermal overload protection apparatus for an electrical device which is formed on an underlying structure, the apparatus comprising:
    a first and second contact area integrally formed on the underlying structure, the contact areas being separated by a gap area;
    underbump metallurgy layers overlying each of the first and second contact areas and separated by the gap area, each underbump metallurgy layer having an upper surface with at least a portion of each upper surface covered by a wettable material defining a wettable area;
    a solder bump formed on the wettable areas, the solder bump forming a solder bridge between the contact areas;
    wherein an overload condition applied across the first and second contact areas and through the solder bridge will cause the solder bridge to melt, and the wettable material will draw the molten solder out of the gap area and onto the wettable areas, thereby opening the electrical connection between the contact areas.

2. The integrated thermal overload protection apparatus of claim 1, wherein the underlying structure includes at least a semiconductor substrate layer.

3. The integrated thermal overload protection apparatus of claim 2, wherein the electrical device is monolithically formed with the thermal overload protection apparatus.

4. The integrated thermal overload protection apparatus of claim 1, wherein the wettable material includes Au.

5. The integrated thermal overload protection apparatus of claim 1, wherein the contact area is formed from aluminum.

6. An integrated thermal overload protection apparatus for an electrical device which is formed on an underlying structure including at least a semiconductor substrate layer, the apparatus comprising:
    a first and second contact area integrally formed on the underlying structure, the contact areas each having an upper surface and separated by a gap area, wherein at least one underbump metallurgy layer is applied between the contact areas and a wettable material, the wettable material defining a wettable area;
    a solder bump formed on the wettable areas, the solder bump forming a solder bridge between the contact areas;
    wherein an overload condition applied across the first and second contact areas and through the solder bridge will cause the solder bridge to melt, and the wettable material will draw the molten solder out of the gap area and onto the wettable areas, thereby opening the electrical connection between the contact areas.

7. The integrated thermal overload protection apparatus of claim 6, wherein a first underbump metallurgy layer is formed from a barrier/adhesion material and a second underbump metallurgy layer is formed from a SEED material.

8. The integrated thermal overload protection apparatus of claim 7, wherein the first barrier/adhesion material includes Ti, and the SEED material includes Cu.

9. A method for forming an integrated thermal overload protection apparatus on the underlying structure of an electrical device according to semiconductor process steps, the method comprising:
    forming on the underlying structure a first metallic contact area and a second metallic contact area separated by a gap area, with an opening through a passivation layer for accessing the contact areas and gap area;
    applying a barrier/adhesion underbump metallurgy layer;
    applying an SEED underbump metallurgy layer;
    applying a photoresist mask to define wettable areas on the first and second contact areas;
    forming a wettable material onto the defined wettable areas, and stripping away the photoresist;
    applying a photoresist mask to define the gap area;
    etching away the underbump metallurgy layers, and stripping away the photoresist;
    applying a photoresist mask to define a solder bridge area;
    forming a solder bridge between the first and second contact areas, and stripping away the photoresist; and
    applying a flux to the solder bridge area.

10. The method for forming an integrated thermal overload protection apparatus of claim 9, wherein an overload condition applied across the first and second contact areas and through the solder bridge will cause the solder bridge to melt, and the wettable material will draw the molten solder out of the gap area and onto the wettable areas, thereby opening the electrical connection between the contact areas.

11. The method for forming a thermal overload protection apparatus of claim 10, wherein the barrier/adhesion is formed from Ti, and the SEED underbump metallurgy layer is formed from Cu.

12. The thermal overload protection apparatus of claim 9, wherein the wettable material includes Au.

13. The thermal overload protection apparatus of claim 9, wherein the contact area is formed from Aluminum.

14. A method for forming an integrated thermal overload protection apparatus on the underlying structure of an electrical device, the method comprising:
    forming on the underlying structure a first metallic contact area and a second metallic contact area separated by a gap area;
    forming underbump metallurgy layers over each of the first and second metallic contact areas, the underbump metallurgy layers being separated by the gap area;
    defining wettable areas on the underbump metallurgy layers of the first and second contact areas;
    forming a wettable material onto the defined wettable areas;
    defining a solder bridge area;
    forming a solder bridge to span the first and second contact areas; and
    applying a flux to the solder bridge area.

15. The method for forming an integrated thermal overload protection apparatus of claim 14, wherein the underlying structure of the electrical device is a semiconductor substrate.

16. The method for forming an integrated thermal overload protection apparatus of claim 15, wherein the method uses standard semiconductor process steps.

17. The method for forming an integrated thermal overload protection apparatus of claim 14 wherein the underbump metallurgy layer further comprises a barrier/adhesion underbump metallurgy layer directly overlying each of the first and second contacts and a SEED underbump metallurgy layer overlying the barrier/adhesion underbump metallurgy layer.

18. A method for providing electrical overload protection to an associated device having a foundational material, the method comprising:

forming a thermally responsive fuse device directly on the foundational material of the associated device, wherein the associated device is monolithically formed with the thermally responsive fuse device, the thermally responsive fuse device further including:
a first and second contact area integrally formed on the foundational material, the contact areas being separated by a gap area;
underbump metallurgy layers overlying each of the first and second contact areas and separated by the gap area, each underbump metallurgy layer having an upper surface with at least a portion of each upper surface covered by a wettable material defining a wettable area; and
a solder bump formed on the wettable areas, the solder bump forming a solder bridge between the contact areas;
wherein an overload condition applied across the first and second contact areas and through the solder bridge will cause the solder bridge to melt, and the wettable material will draw the molten solder out of the gap area and onto the wettable areas, thereby opening the electrical connection between the contact areas.

19. The method for providing electrical overload protection to an associated device of claim 18, wherein the foundational material of the associated device is a semiconductor substrate and wherein the method uses semiconductor process steps.

20. A method for forming an integrated thermal overload protection apparatus on the underlying structure of an electrical device, the method comprising:

forming on the underlying structure a first conductive contact area and a second conductive contact area separated by a gap area;
forming an underbump metallurgy layer overlying the first and second conductive contact areas;
applying a photoresist mask to define wettable areas on the underbump metallurgy layer;
forming a wettable material onto the defined wettable areas, and stripping away the photoresist;
applying a photoresist mask to define the gap area;
etching away the underbump metallurgy layers to form the gap area, and stripping away the photoresist;
applying a photoresist mask to define a solder bridge area;
forming a solder bridge between the first and second contact areas, and stripping away the photoresist; and
applying a flux to the solder bridge area.

21. An integrated thermal overload protection apparatus for an electrical device which is formed on an underlying structure, the apparatus comprising:

first and second contact areas integrally formed on the underlying structure, the first and second contact areas being separated by a gap area;
a layer of wettable material overlying each of the first and second contact areas and separated by the gap area, the wettable material defining wettable areas, the wettable material being a material selected from the group consisting of gold, paladium and platinum; and
a solder bump formed on the wettable areas of the first and second contact areas, the solder bump forming a solder bridge between the contact areas.

22. The integrated thermal overload protection apparatus of claim 21 wherein the first and second contact areas each further include an underbump metallurgy layer underlying each layer of wettable material.

* * * * *

UNITED STATES PATENT AND TRADEMARK OFFICE
Certificate

Patent No. 6,201,679

Patented: March 13, 2001

On petition requesting issuance of a certificate for correction of inventorship pursuant to 35 U.S.C. 256, it has been found that the above-identified patent, through error and without deceptive intent, improperly sets forth the inventorship.

Accordingly, it is hereby certified that the correct inventorship of this patent is: Dominick Richiuso, Saratoga, CA; and Faraj A. Sherrima, Milpitas, CA.

Signed and Sealed this Second Day of October 2001.

JOSIE BALLATO
*Supervisory Patent Examiner*
Art Unit 2836